(12) United States Patent
O et al.

(10) Patent No.: US 7,981,753 B1
(45) Date of Patent: Jul. 19, 2011

(54) METHOD AND DEVICE FOR ELECTROSTATIC DISCHARGE PROTECTION

(75) Inventors: Hugh Sungki O, Fremont, CA (US); Chih-Ching Shih, Pleasanton, CA (US); Cheng-Hsiung Huang, Cupertino, CA (US); Yow-Juang Bill Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/683,402

(22) Filed: Jan. 6, 2010

Related U.S. Application Data

(62) Division of application No. 10/956,758, filed on Sep. 30, 2004, now Pat. No. 7,671,416.

(51) Int. Cl.
*H01L 21/331* (2006.01)

(52) U.S. Cl. .................. 438/309; 257/E29.264

(58) Field of Classification Search .......... 257/360–365, 257/355, 173; 438/309, 277, 284
See application file for complete search history.

(56) References Cited

U.S. PATENT DOCUMENTS

| | | | |
|---|---|---|---|
| 6,476,449 B1 * | 11/2002 | Lin | 257/360 |
| 7,302,378 B2 * | 11/2007 | Hayashi | 703/14 |
| 2003/0081363 A1 * | 5/2003 | Kawashima et al. | 361/56 |

* cited by examiner

*Primary Examiner* — Nathan W Ha
(74) *Attorney, Agent, or Firm* — Martine Penilla & Gencarella, LLP

(57) ABSTRACT

A device for providing electrostatic discharge (ESD) protection is provided. The device includes a semiconductor substrate having a drain, a source, and a gate formed therein. The drain contains a region having a resistance that is higher than the resistance of the remainder of the drain and the source. The gate region is in contact with this higher resistance region and the source. In one embodiment, the higher resistance is lacking silicide in order to provide the higher resistance. A method of forming a device for providing ESD protection is included.

10 Claims, 9 Drawing Sheets

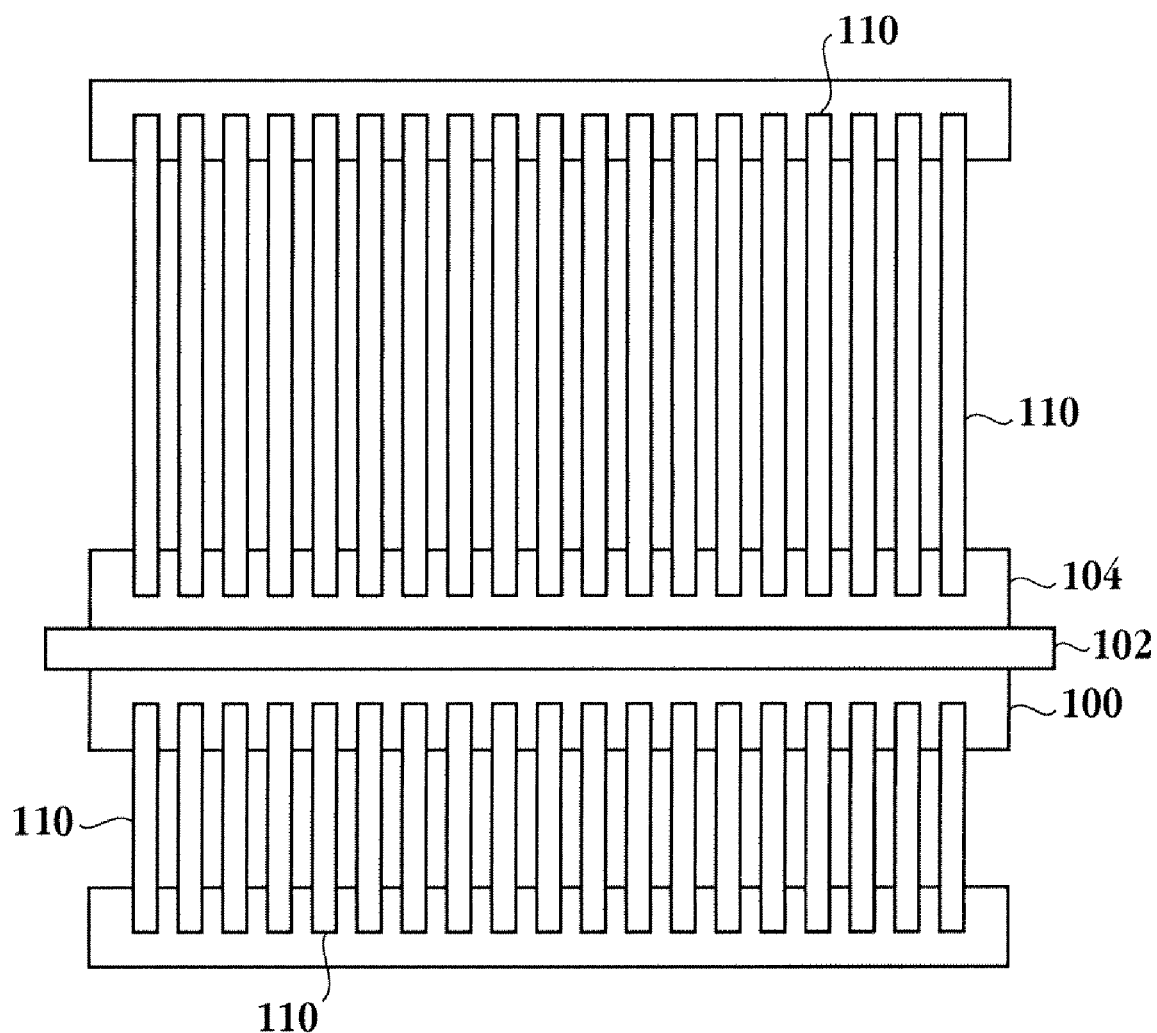
Fig. 1 *(Prior Art)*

METHOD AND DEVICE FOR ELECTROSTATIC DISCHARGE PROTECTION

CROSS REFERENCE TO RELATED APPLICATION

This application is a divisional application of U.S. patent application Ser. No. 10/956,758 filed on Sep. 30, 2004 now U.S. Pat. No. 7,671,416, and entitled, "METHOD AND DEVICE FOR ELECTROSTATIC DISCHARGE PROTECTION." The disclosure of this related application is incorporated herein by reference for all purposes.

BACKGROUND OF THE INVENTION

1. Field of the Invention

The present invention relates generally to electrostatic discharge (ESD) protection in semiconductor devices, and in particular to providing ESD protection to input output devices by having current uniformity in the input output devices.

2. Description of the Related Art

ESD is the rapid, spontaneous transfer of electrostatic charge that occurs between bodies at different electrostatic potential and may be induced by direct contact or by an electrostatic field. ESD causes high current flow in electronic components. The high current flow can damage the electronic components. Also, the heat dissipated during ESD can be high and the corresponding high temperature can damage the electronic components. As a result, ESD protection has become a major focus for the electronic industry.

FIG. 1 is a simplified schematic diagram illustrating a transistor having a conventional ESD protection scheme. The transistor includes a drain 100, a gate 102, and a source 104. The transistor further includes poly-resistors 110 on the side of the drain 100 and the source 104. The ESD current flow is spread among the poly-resistors 110 so that the effect of the current will be divided among the numerous poly-resistors 110. In this manner, the intensity of the current flow to any particular poly-resistor 110 will be diminished, thereby preventing damage to the device. One of the shortcomings with this approach is that a silicide film is used for the resistors and the transistors for reducing the resistance of the drain, source, and gate regions. The narrow width of the silicide film leads to uneven distribution of its resistance profile and impacts the uniformity of the current flow. As the current will take the path of least resistance, the current will go through poly-resistors having the least resistance, caused by the uneven distribution of the silicide film, thus generating hot-spots where damage can occur. Also, the lower resistance caused by the silicide in the poly-resistor may enable the current due to ESD to flow to the gate region. Accordingly, there exists a high probability that the gate region will be damaged by the current from the ESD resulting in a damaged semiconductor device. Additionally, on the source side, the poly-resistors 110 cause a voltage drop in the source region. This voltage drop raises the source potential. In turn, the raised potential impedes the turn-on of the substrate, thereby making it hard to turn on the diode between the source and the substrate, which makes it more difficult to turn on the transistor.

In view of the foregoing, there is a need for semiconductor devices that can uniformly spread an ESD current, and further, there is a need for transistors that can be more easily turned on.

SUMMARY OF THE INVENTION

Broadly speaking, the present invention fills these needs by providing a device and method for electrostatic discharge (ESD) protection in semiconductor devices. The embodiments of the present invention provide a sub-region of a high resistance in the drain. The sub-region in the drain is placed in close contact with the gate so that the resistance near the gate is higher compared to the other proximate regions. This higher resistance helps to direct the current due to ESD away from the gate, since the current takes the path of least resistance. The invention essentially forces the current to uniformly pass through the substrate instead of to the gate. The present invention may be implemented in numerous ways, including a device and a method for forming a device. Several embodiments of the present invention are described below.

In one aspect of the invention, a device for providing electrostatic discharge (ESD) protection is provided. The device includes a semiconductor substrate having a drain, a source, and a gate formed therein. The drain contains a region having a resistance that is higher than the resistance of the remainder of the drain and the source. The gate region is in contact with or proximate to this higher resistance region. The gate is also in contact with the source. In one embodiment, the higher resistance region is lacking silicide (silicide-free) in order to provide the higher resistance. In another embodiment, the device includes a poly resistor that is coupled to the drain through a metal contact. The poly resistor is composed of elements that provide added resistance to the path of the ESD current, in order to prevent the ESD current from reaching the gate region.

In another embodiment of the invention, a method of forming a device for providing electrostatic discharge (ESD) protection is provided. The method includes forming a source region, drain region, and gate region on a semiconductor substrate. A region in the drain having a first resistance is then formed. The region in the drain is maintained at a higher resistance than the remainder of the drain region so that the current due to ESD may be blocked by the region in the drain.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 1 is a simplified schematic diagram illustrating a transistor having Electrostatic Discharge (ESD) protection.

DETAILED DESCRIPTION

An invention for electrostatic discharge (ESD) protection in semiconductor devices is provided. The embodiments of the present invention include a sub-region in the drain having a high resistance compared to the rest of the region in the drain. The sub-region in the drain is placed in close contact with the gate region so that the resistance of the current path increases from the drain to the gate region. Accordingly, the current due to ESD will avoid taking the path from the drain to the gate region and will take another path having a lower resistance. In the following description, numerous specific details are set forth in order to provide a thorough understanding of the present invention. It will be apparent, however, to one skilled in the art that the present invention may be practiced without some or all of these specific details.

Figure 2A:
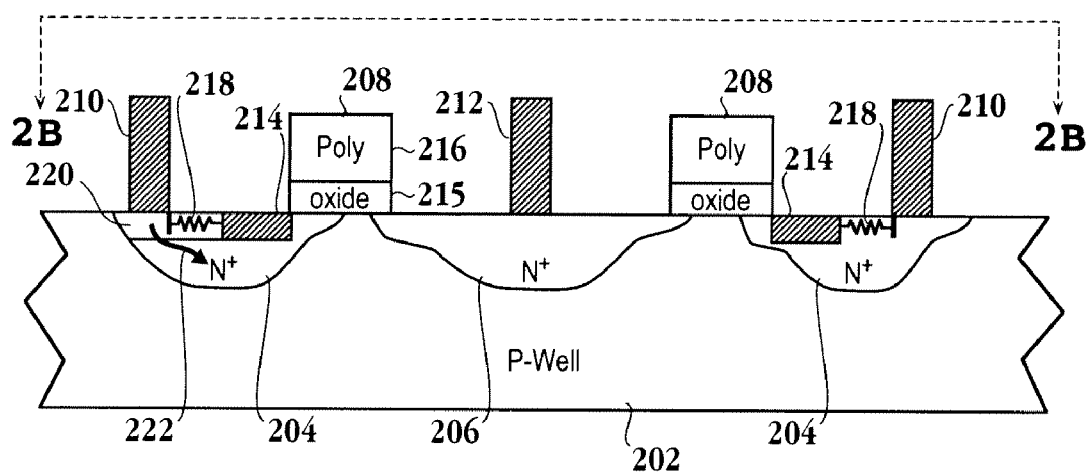
FIG. 2A illustrates an ESD protection circuit in accordance with an embodiment of the present invention

FIG. 2A shows an ESD protection circuit in accordance with an embodiment of the present invention. The ESD protection circuit includes a P-type substrate 202. A plurality of n-type diffusion regions 204, and 206 are formed on the p-type substrate 202. The n-type diffusion regions 204 and 206 form the drain and source, respectively, of an NMOS transistor. A gate 208 is formed in the region between the drain and the source. The gate 208 includes an oxide layer 215 and a poly-silicon layer 216 disposed over the oxide layer. Together, the drain, the gate 208 and the source make up an NMOS transistor. A sub-region of high resistance 214 is formed in the drain, in a region that lies immediately adjacent to gate oxide 215 of the gate 208. In one embodiment, the sub-region of high resistance 214 is in contact with the region under the gate 208, i.e., gate oxide 215. In another embodiment, the sub-region of high resistance is formed at a distance of about 0.1 μm to about 5.0 μm from the gate.

According to this embodiment, a plurality of contacts 210 and 212 are formed on the drain and source, respectively. The contacts 210 and 212 are conductors and are preferably composed of metal. However, the contacts can be composed of any suitable material that conducts electricity. In one embodiment, the distance between the contact 210 and the gate 208 is in the range of about 0.5-2.0 micron for a 90 nm die. The drain contains a diffusion region 220 and a sub-region of high resistance 214. The present invention utilizes the resistance of the diffusion region 220, and the sub-region of high resistance 214 to spread the current uniformly. The resistance of the diffusion region 220 is represented by the resistor symbol 218. In one embodiment, the higher resistance for the sub-region 214, relative to the diffusion region 220, is produced by avoiding silicide formation in the sub-region. The process involved in forming the sub-region of high resistance 214 is described in detail below with reference to FIGS. 5A-5H.

By blocking silicide formation in the sub-region of high resistance 214, as described in more detail below, the resistivity of the sub-region of high resistance, can be increased at least by one order of magnitude. With the embodiment described herein, when an ESD occurs, the current due to the ESD takes on the path indicated by the arrow 222 in FIG. 2A. The high resistance near the gate due to the sub-region of high resistance 214 forces the current to go down to the silicon bulk of the p-substrate 202. The source includes the silicide film, which helps to reduce the resistance on the source side. It should be appreciated that the lower resistance of the source allows for an easier turn-on of the parasitic bipolar transistor. It should be appreciated that the width of the sub-region of high resistance 214 can be varied depending on the resistance required. In one embodiment, the width ranges from about 0.1 μm to about 5.0 μm.

Figure 2B:
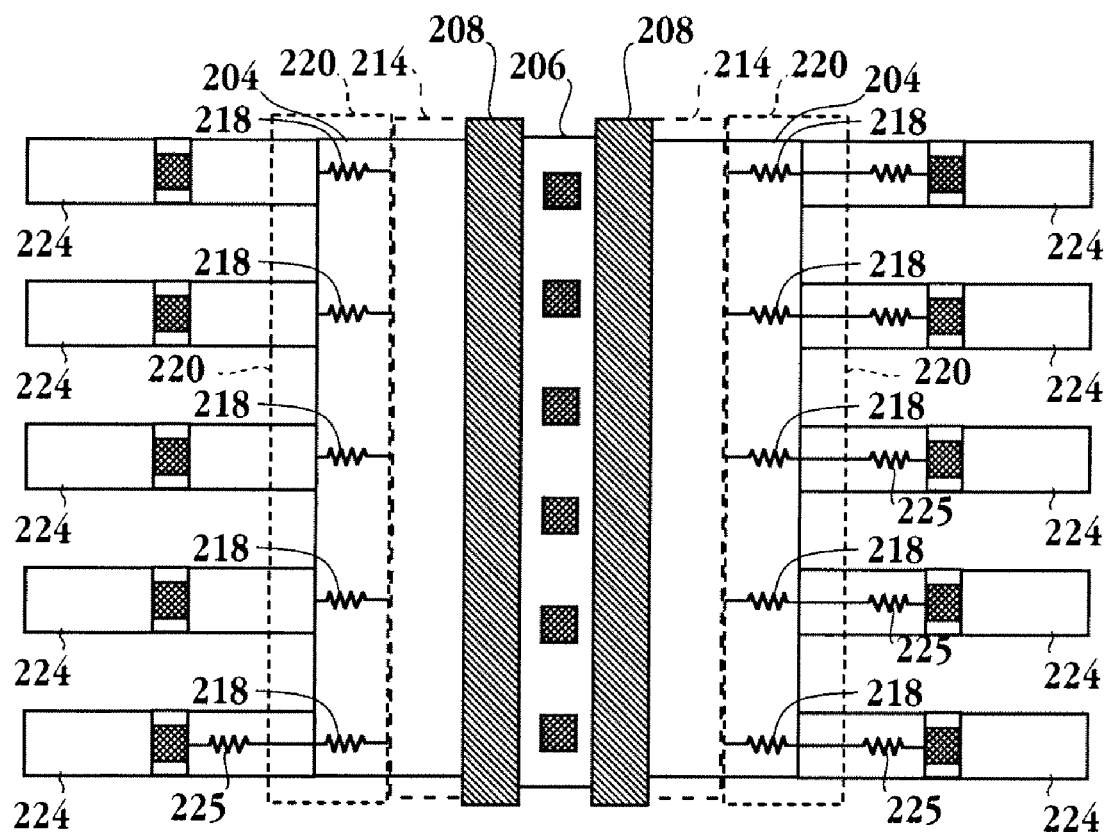
FIG. 2B is a simplified top view of the ESD protection circuit illustrated in FIG. 2A.

FIG. 2B shows a top view of the ESD protection circuit illustrated in FIG. 2A in accordance with an embodiment of the invention. FIG. 2B shows the sub-region of high resistance 214 overlapping the gate 208. The diffusion region 220 has a resistance that is represented by the diffusion resistor symbol 218. The use of the resistance of the diffusion region 220 in conjunction with the sub-region of high resistance 214, helps to save real estate space on the die by avoiding the requirement of the additional poly-resistors. Moreover, the use of the resistance of the diffusion region 220 helps to spread the current uniformly over the diffusion region 220, thereby reducing the impact of an ESD on any specific region. FIG. 2B further includes alternating fin resistors 224 connected to the drain 204. The fin resistor resistance is represented by the fin resistor symbol 225. As shown, fin resistors 224 are connected to certain areas in the diffusion region 220 and not to other areas. This connection scheme is configured to provide sufficient resistance to spread out the ESD current. In order to enhance spreading of the current due to an ESD in the drain, the diffusion regions that are not connected to the fin resistors 224 are constructed without silicide, in one embodiment. As described earlier, the resistance of the source 206 is maintained low relative to the drain, which helps to keep the source 206 at ground potential, in order to facilitate an easier turn-on of the parasitic bipolar transistor. As such, diffusion resistors and other types of resistors that might increase the resistance of the source 206, are avoided in the region that is in close proximity with the source 206. Although FIGS. 2A and 2B illustrate an NMOS transistor, it is understood and appreciated that the embodiments described herein are applicable to other types of transistors such as PMOS transistors.

Figure 3A:
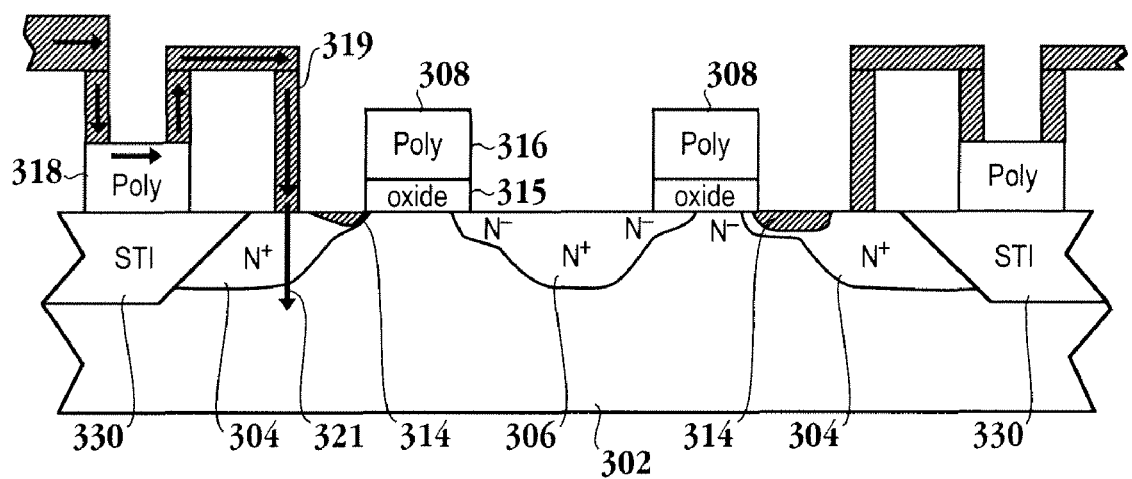
FIG. 3A, illustrates an ESD protection circuit utilizing poly-resistors in accordance with one embodiment of the invention.

Another embodiment is presented in FIG. 3A, illustrating an ESD protection circuit utilizing poly-resistors in place of the diffusion resistors in the drain region. In FIG. 3A, a plurality of n-type diffusion regions 304, and 306 are formed on the p-type substrate 302. The n-type diffusion regions 304 and 306 form the drain and source, respectively, of an NMOS transistor. A gate 308 is formed in the region between the drain 304 and the source 306. The gate 308 includes an oxide layer 315 and a poly-silicon layer 316, disposed over the oxide layer 315. Together, the drain 304, the gate 308 and the source 306 make up an NMOS transistor. A sub-region of high resistance 314 is formed in the drain 304. In one embodiment, the sub-region of high resistance 314 is adjacent to an edge of the gate 308. In another embodiment, the sub-region of high resistance 314 is in contact with a bottom surface of the gate 308, i.e., the sub-region of high resistance is defined under a portion of the bottom surface of the gate. In yet another embodiment, the sub-region of high resistance 314 is not in contact with the gate oxide 315 of the gate 308, i.e., there is a gap between the two. Where there exists a gap between the two, the distance between the gate 308 and the region of high resistance 314 is between about 0.1 μm to about 5.0 μm.

The drain 304 is connected to a poly-resistor 318 via metal connect 319. The poly resistor 318 has a higher resistance relative to the drain. In one embodiment, the high resistance is caused by the poly-resistor 318 having no silicide. Shallow trench isolation 330 (STI) is used to separate the poly-resistor 318 from the p-substrate 302. This way, when an ESD occurs, the current passes through the poly resistor 318 and the metal contact 319 into the drain region 304. The current due to the ESD is then directed to the silicon substrate 302, as indicated by arrow 321. The damaging effect of the current due to the ESD, on the p-substrate 302, is blocked through the poly-resistor 318 and the STI 330. Furthermore, the sub-region of high resistance 314 prevents the current from flowing to the gate 308 from the drain 304, thus protecting the device from being damaged due to the ESD.

Figure 3B:
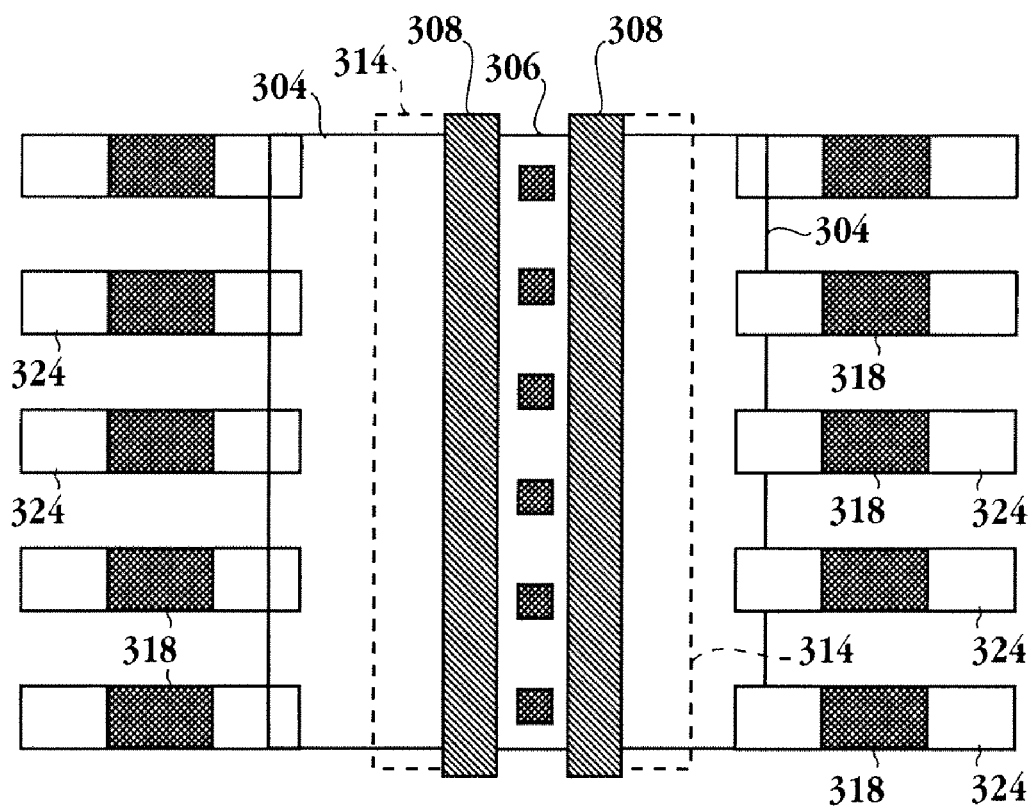
FIG. 3B is a simplified top view of the ESD protection circuit illustrated in FIG. 3A.

FIG. 3B is a simplified top view of the ESD protection circuit illustrated in FIG. 3A in accordance with an embodiment of the invention. FIG. 3B shows the poly resistor 318 connected to the drain 304. FIG. 3B also shows fin resistors 324 connected to the drain 304. The drain 304 includes a sub-region of high resistance 314. The poly-resistor 318, together with the sub-region of high resistance 314, directs the current from an ESD into the silicon substrate 302 and away from the gate 308.

Figure 4:
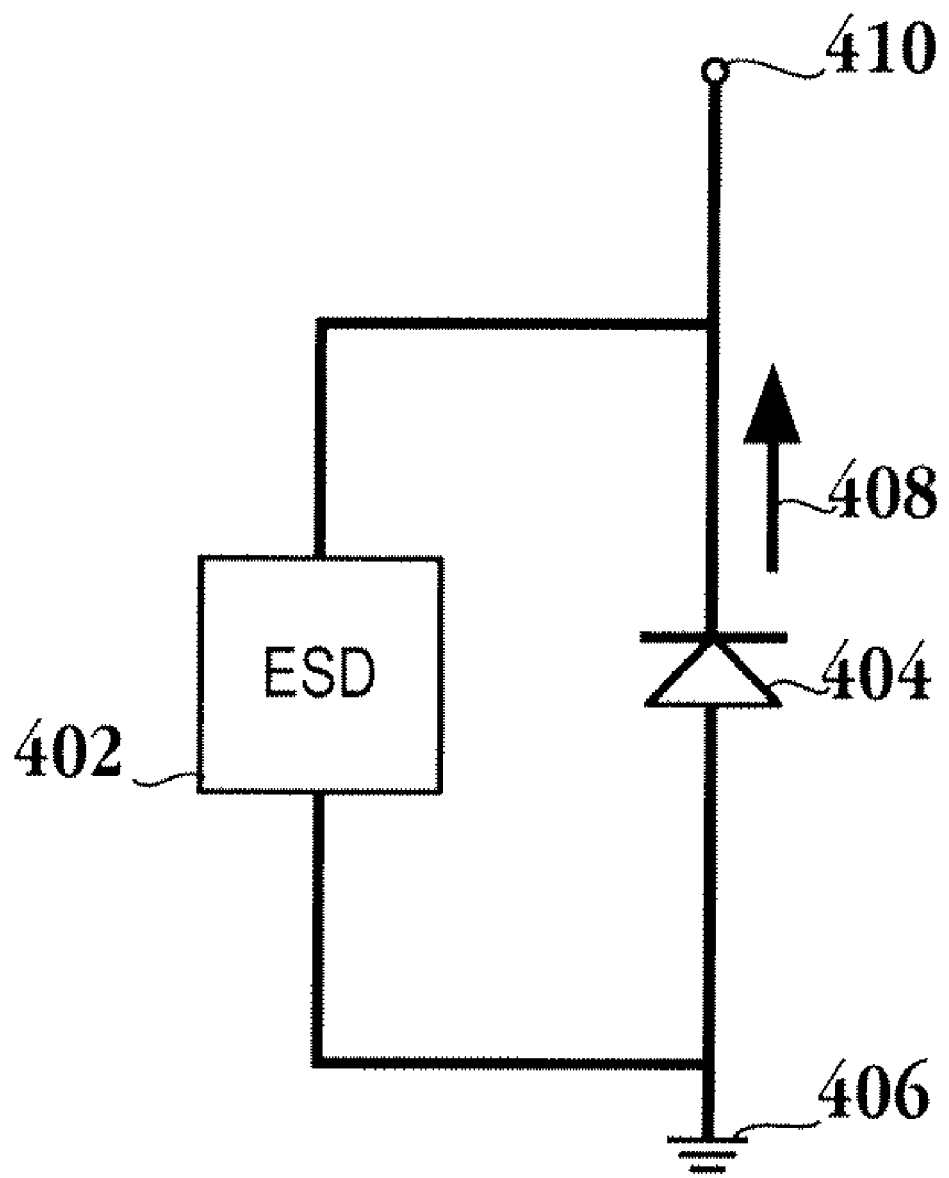
FIG. 4 is an alternative embodiment of an ESD protection circuit in accordance with an embodiment of the present invention.

FIG. 4 is an alternative embodiment of the ESD protection circuit in accordance with an embodiment of the present invention. The embodiments illustrated in FIGS. 2A and 3A generally provide ESD protection due to a positive charge. FIG. 4 shows an ESD protection circuit 402 connected in parallel with a diode 404. The ESD protection circuit 402 is of the kind described in FIGS. 2A and 3A. That is, a sub-region of high resistance is included with or without poly-resistors as illustrated in FIGS. 2A-3B. Due to the added resistance on the drain side, in the ESD protection circuit described above, the substrate diode between the drain and the substrate cannot effectively conduct the ESD current during a negative ESD occurrence. Therefore, a separate diode 404 is added as shown in FIG. 4. When a negative ESD occurs, the current is directed to an input/output node 410 from ground 406 through the diode 404 as indicated by arrow 408.

Figure 5A:
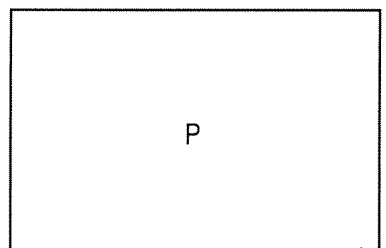
FIGS. 5A-5H illustrate a scheme for fabricating the ESD protection circuit in accordance with an embodiment of the invention.
Figure 5B:
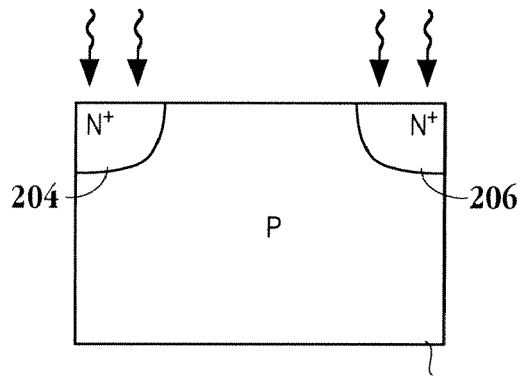

FIGS. 5A-5H illustrate a scheme for fabricating the ESD protection circuit described above in accordance with an embodiment of the invention. Initially a silicon substrate 202 is provided. Next, a p-well (not shown) is formed in the substrate 202 by methods such as boron implant or through any other known semiconductor process. Alternately, a p-silicon substrate may be used as shown in FIG. 5A. Then, in FIG. 5B a plurality of n diffusion regions are formed in the p-silicon substrate 202. The n diffusion regions form the drain 204 and source 206, respectively, of an NMOS transistor. One skilled in the art will appreciate that known semiconductor processing techniques may be used for forming the n diffusion regions. Thereafter, a gate 208 defined by poly-silicon layer 216, disposed over gate oxide layer 215, is formed over the silicon substrate 202 between the drain 204 and the source 206.

Figure 5C:
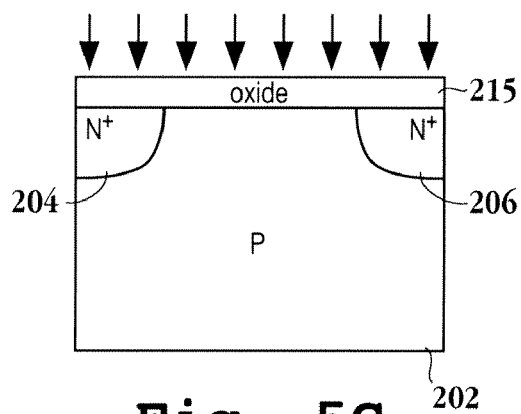
Figure 5D:
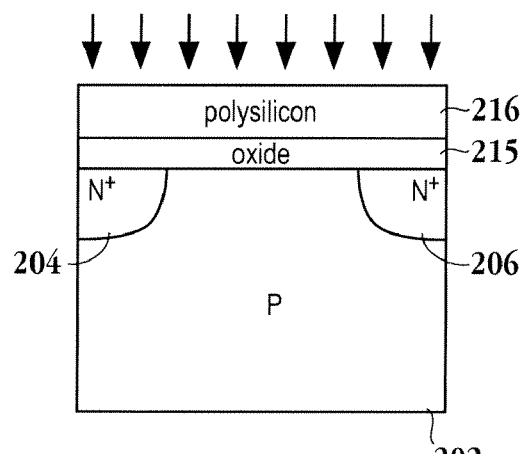
Figure 5E:
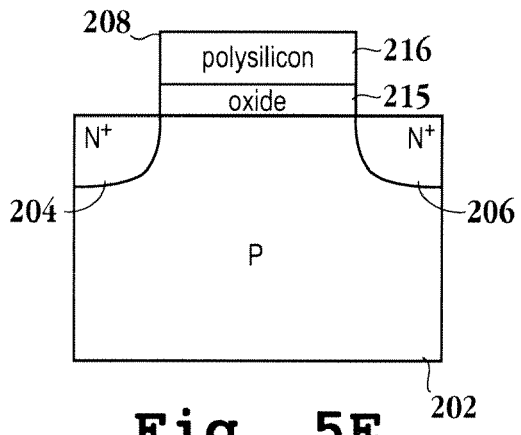
Figure 5F:
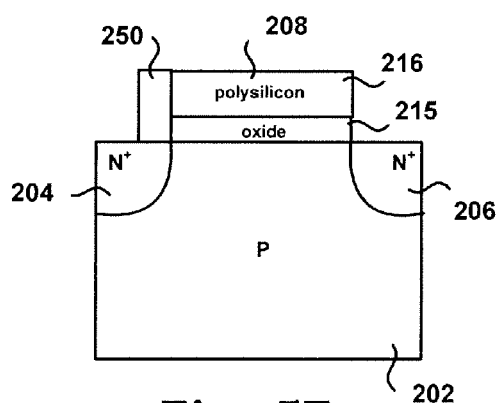
Figure 5G:
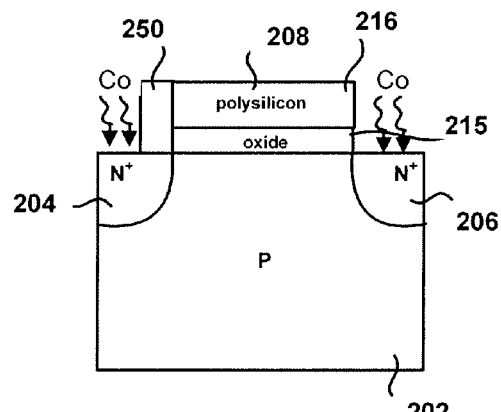
Figure 5H:
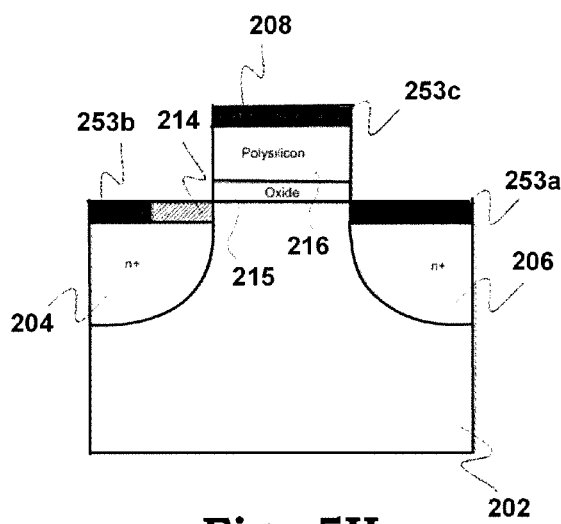

In one embodiment, the gate is formed by first depositing an oxide layer 215 on top of the silicon substrate 202, followed by depositing a poly-silicon layer 216 upon the oxide layer 215 as illustrated in FIGS. 5C and 5D. Masking and etching steps are used to define the gate 208 shown in FIG. 5E. Together, the drain 204, the gate 208, and the source 206 make up an NMOS transistor. Then, as shown in FIG. 5F, a mask 250 is deposited in the drain region over a portion of the drain 204 next to the gate 208, without overlapping the gate. In one embodiment, the mask may overlap the gate 208. Any suitable photoresist may be applied and developed to form mask 250. In FIG. 5G a refractory metal layer, such as cobalt (Co) is deposited over the drain 204, the source region 206, and the gate 208. The deposited layer is thermo-cycled to form the silicide material, e.g., cobalt silicide (CoSi$_2$). In one embodiment, the implanted cobalt is followed by a rapid thermal annealing to form CoSi$_2$ in part of the drain, in the source region, and in the gate. Subsequently, the mask 250 may be removed by etching or through other means as shown in FIG. 5H. As can be seen, in FIG. 5H, a sub-region of high resistance 214 is formed in the drain region next to the gate 208. Regions 253a, 253b, and 253c have low resistance as regions 253a, 253b, and 253c contain silicide. As described in detail above with respect to FIGS. 2A and 3A, the sub-region of high resistance 214 protects the semiconductor device by blocking the path of the current due to an ESD from reaching the gate 208.

Silicide formation, as described above, typically requires a refractory metal to be deposited on the silicon wafer. Thereafter, a high temperature thermal anneal process produces the silicide material by causing the refractory metal to react with the silicon. As used herein, a silicide is a metal compound that is thermally stable and provides for low electrical resistivity at the silicon refractory metal interface. One skilled in the art will appreciate that titanium, cobalt, and nickel are common refractory metals used for contacts in aluminum interconnect technologies. Copper interconnect technologies typically use cobalt or nickel metals to form silicides. Table 1 illustrates exemplary silicides and their corresponding resistivity.

TABLE 1

| Silicide | Resistivity ($\mu\Omega$/cm) |
| --- | --- |
| Cobalt/Silicon (CoSi$_2$) | 13-19 |
| Molybdenum/Silicon (MoSi$_2$) | 40-70 |
| Platinum/Silicon (PtSi) | 28-35 |
| Titanium/Silicon (TiSi$_2$) | 13-17 |
| Tantalum/Silicon (TaSi$_2$) | 35-55 |
| Tungsten/Silicon (WSi$_2$) | 24-31 |

Figure 6:
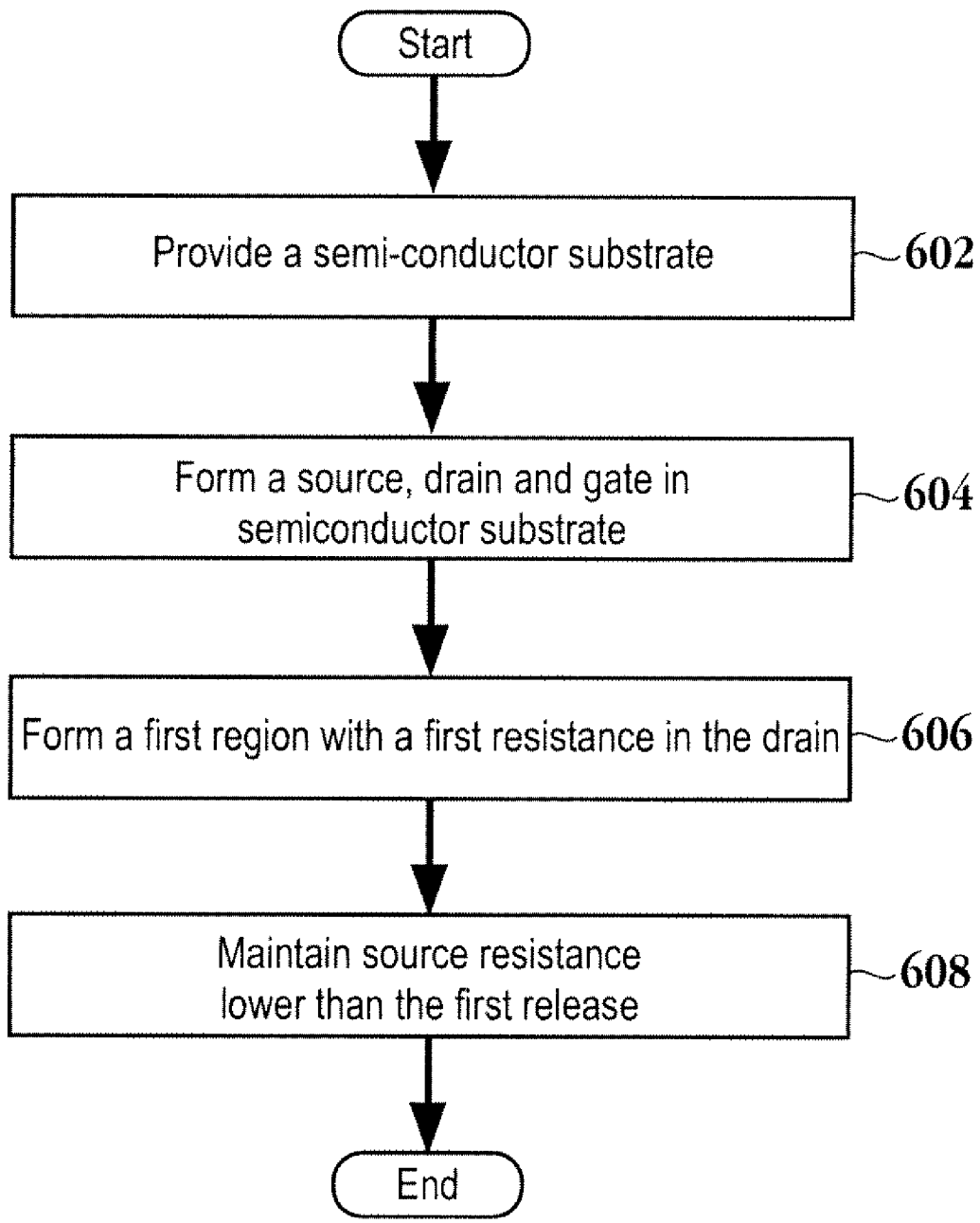
FIG. 6 is a flow chart illustrating the method of operations involved in forming a device having an ESD protection in accordance with an embodiment of the invention.

FIG. 6 is a flow chart illustrating the method of operations involved in making an ESD protection circuit in accordance with an embodiment of the invention. The method initiates with providing a semiconductor substrate as shown in operation 602. The substrate may be of p-type or n-type. Then, in operation 604, a source, a drain, and a gate are formed in the semiconductor substrate. The source, drain, and gate may be formed using any of the standard semiconductor processing procedures, e.g., the techniques discussed with reference to FIGS. 5A-5H may be employed. As described above, the source, drain, and gate together form a transistor of n or p type. Next, in operation 606, a first region is formed in the drain. The first region, which may be referred to as a drain sub-region or sub-region of high resistance, is associated with a first resistance. The remainder of the drain has a second resistance wherein, the first resistance is higher than the second resistance. In one embodiment, the first resistance is at least an order of magnitude greater than the second resistance. The first region is in close proximity, adjacent to, or overlapping with the gate so that an ESD current is prevented from reaching the gate. As described above, the first region may be formed by avoiding, or preventing, silicide formation within the first region, i.e., the first region is silicide-free. Thus, in one embodiment, the first region has a resistance that is an order of magnitude greater than the resistances listed in Table 1, where the values listed in Table 1 are representative of the resistance of the remainder of the drain region, i.e., the second resistance. In one embodiment, the remainder of the drain region may have silicide incorporated therein to maintain a lower resistance in the second region as compared to the first region. The source resistance is maintained lower than the first resistance as indicated in operation 608, so that the parasitic bipolar transistor can be turned-on easily. In one embodiment, the source resistance is maintained lower by incorporating silicide therein, as illustrated with reference to FIGS. 5A-5H.

The embodiments thus far were described with respect to ESD protection devices. It is understood and the appreciated that the device described herein may be used to provide protection from other incidents. For example, problems that are caused when input/output power supplies are triggered may be alleviated through the above-described embodiments. The ESD protection device described herein may be incorporated into any suitable integrated circuit. For example, the ESD protection device may be incorporated into a programmable logic device. The programmable logic device may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method of forming a device for providing electrostatic discharge (ESD) protection, comprising:
    forming a source region and a drain region, on a semiconductor substrate;
    forming a gate oxide on a surface of the semiconductor substrate between the source region and the drain region;
    forming a first region having a first resistance in the drain region; and
    forming a second region having a second resistance in the drain region, wherein a first edge of the gate oxide is separated from the first region of the drain region, wherein a second edge of the gate oxide is in contact with the source region, and wherein the first region is disposed below a portion of the gate oxide.

2. The method of claim 1, wherein a resistance value of the first resistance is higher than a resistance value of the second resistance.

3. The method of claim 1, wherein forming the first region includes,
    masking a portion of the drain region;
    depositing cobalt in an exposed portion of the drain region; and
    forming cobalt silicide in the exposed portion of the drain region.

4. The method of claim 1, further comprising:
    forming a polysilicon resistor; and
    coupling the polysilicon resistor to the drain region through a metal contact.

5. The method of claim 1, wherein a resistance value of the second resistance is at least an order of magnitude less than a resistance value of the first resistance.

6. A method of forming a device for providing electrostatic discharge (ESD) protection, comprising:
    forming a source region and a drain region, on a semiconductor substrate;
    forming a gate oxide on a surface of the semiconductor substrate between the source region and the drain region;
    forming a silicide free region having a first resistance in the drain region;
    forming a silicide containing region having a second resistance in the drain region, wherein a first edge of the gate oxide is separated from the first region of the drain region, and wherein a second edge of the gate oxide is in contact with the source region, and wherein the first region is disposed below a portion of the gate oxide; and
    coupling a polysilicon resistor to the drain region.

7. The method of claim 6, wherein the polysilicon resistor is silicide free.

8. The method of claim 6, wherein the coupling of the polysilicon resistor further comprises,
    isolating the polysilicon resistor from the semiconductor substrate.

9. The method of claim 6, wherein the coupling of the polysilicon resistor further comprises,
    coupling the polysilicon resistor to the silicide containing region of the drain region.

10. The method of claim 6, further comprises maintaining the silicide free region of the drain region at a same doping concentration level as the drain region.

* * * * *